(12) United States Patent
Thiagarajan et al.

(10) Patent No.: US 7,479,913 B1
(45) Date of Patent: Jan. 20, 2009

(54) CONFIGURABLE ANALOG TO DIGITAL CONVERTER

(75) Inventors: Eashwar Thiagarajan, Bothell, WA (US); Bert Sullam, Bellevue, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 36 days.

(21) Appl. No.: 11/703,873

(22) Filed: Feb. 7, 2007

Related U.S. Application Data (60) Provisional application No. 60/772,419, filed on Feb. 10, 2006.

(51) Int. Cl.
*H03M 1/12* (2006.01)
(52) U.S. Cl. .................................. 341/155; 341/156
(58) Field of Classification Search ................ 341/155, 341/143, 108, 110, 126, 144
See application file for complete search history.

(56) References Cited

U.S. PATENT DOCUMENTS 5,150,120 A * 9/1992 Yunus ........................ 341/143
7,138,932 B1 11/2006 Chen

* cited by examiner

*Primary Examiner*—Rexford Barnie
*Assistant Examiner*—Joseph Lauture
(74) *Attorney, Agent, or Firm*—Blakely, Sokoloff, Taylor & Zafman LLP (57) ABSTRACT

A configurable analog to digital converter (ADC) includes a plurality of analog units to integrate an input signal. The analog units are coupled together to generate a plurality of discrete-time signals responsive to the input signal and are further coupled to a plurality of bus segments via a plurality of interconnect circuits. Each interconnect circuit is configured to selectively couple the analog units to any of the bus segments.

19 Claims, 6 Drawing Sheets

CONFIGURABLE ANALOG TO DIGITAL CONVERTER

CROSS-REFERENCE TO RELATED APPLICATION

This application claims the benefit of U.S. Provisional Application No. 60/772,419, filed Feb. 10, 2006, hereby incorporated by reference.

TECHNICAL FIELD

This disclosure relates generally to electronic circuits, and in particular but not exclusively, relates to analog to digital converters.

BACKGROUND INFORMATION

An analog-to-digital converter (ADC) converts an analog signal (e.g., voltage level) into a corresponding digital signal (e.g., binary word). There are numerous ways to implement an ADC. One type of ADC is a successive approximation register (SAR). A SAR is formed from a comparator and a digital-to-analog converter (DAC). At the start of the conversion cycle, the DAC is set to half scale and a comparison is made between the voltage input and output of the DAC. With each step, the DAC is updated, the next bit is selected, a subsequent comparison made, and the digital value found using a binary search (or "successive approximation") technique.

Another conventional type of ADC is an incremental converter. An incremental converter utilizes an integrator and comparator and a pair of references. The input is integrated on one phase of the clock cycle. The reference is then integrated in the opposite direction in the second phase of the clock cycle. The reference selection, positive or negative, is driven by the comparator, always integrating back to zero. The number of cycles in which the comparator output is positive is then counted to obtain the digital result. This is algorithmically equivalent to a dual slope ADC. The incremental ADC makes 2n comparisons to form an n-bit conversion.

Yet another conventional type of ADC is a delta sigma ADC. The delta sigma ADC utilizes the same integrator/comparator topology as an incremental converter ADC. Rather than integrating the comparator output in a counter, the comparator result is processed in a decimator.

Such conventional ADCs utilize a fixed architecture. That is, a conventional ADC is not reconfigurable after fabrication. Conventional ADCs suffer from pre-selected tradeoffs made during fabrication.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a configurable analog to digital converter (ADC) are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
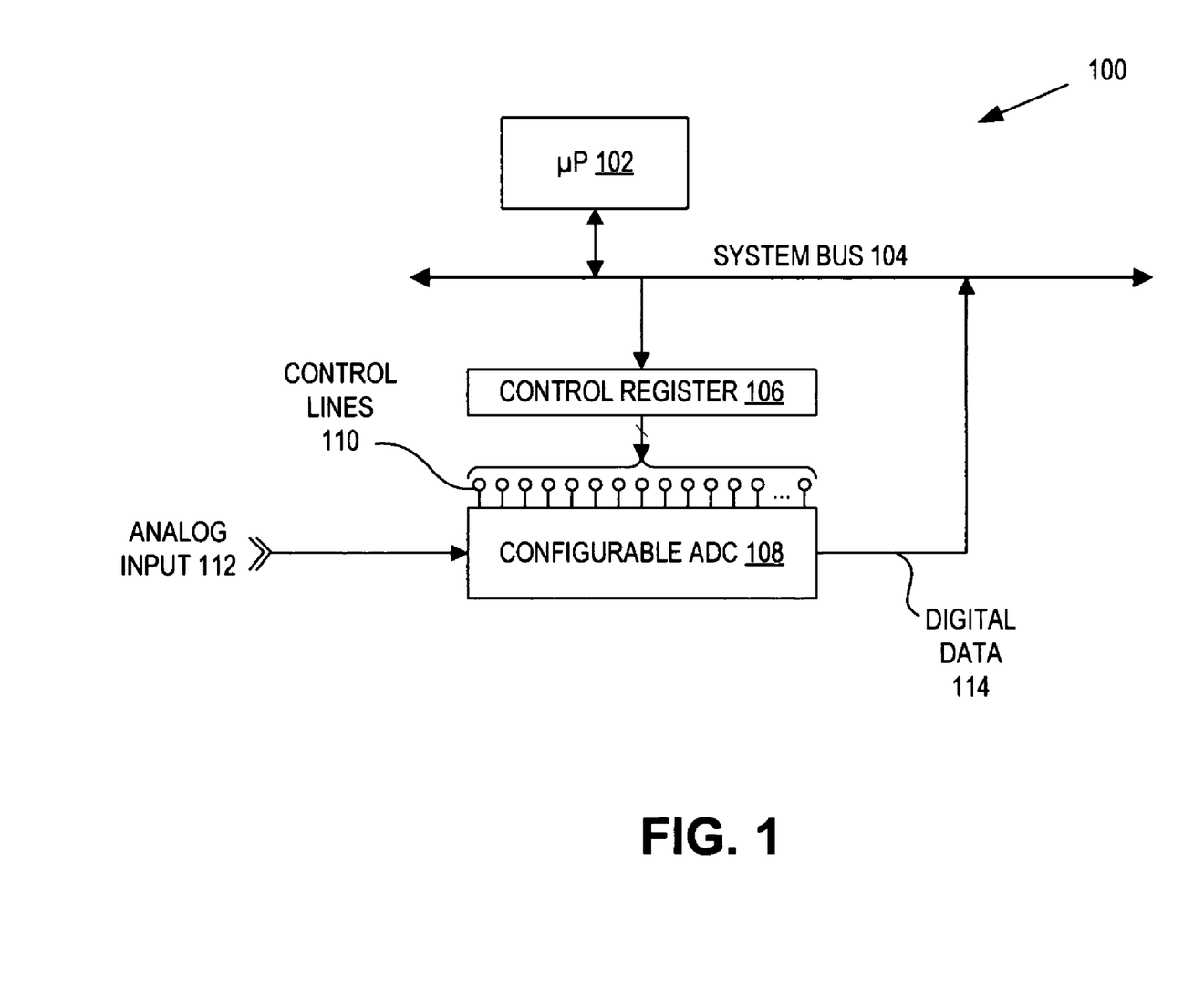
FIG. 1 is a functional block diagram illustrating a system with a configurable analog to digital converter, in accordance with an embodiment of the invention.

FIG. 1 is a functional block diagram illustrating a system 100 with a configurable ADC 108, in accordance with an embodiment of the invention. The illustrated embodiment of system 100 includes a microprocessor 102 coupled to a system bus 104. Also coupled to system bus 104 is a control register 106. System 100 also includes configurable ADC 108 with control lines 110 coupled to control register 106.

In the illustrated embodiment, configurable ADC 108 is coupled to receive an analog input 112, convert the analog input 112 into digital data 114, and output digital data 114 onto system bus 104. In one embodiment, ADC 108 includes selectable orders of analog integration. In one embodiment, ADC 108 includes selectable orders of digital integration. In one embodiment, ADC 108 includes selectable feedback connections.

The configurability of ADC 108 allows the implementation of a variety of different types of ADCs. For example, in one embodiment ADC 108 can be configured to implement a cascade-of-integrators-feedback (CIFB) ADC. In one embodiment, ADC 108 can be configured to implement a multi-stage noise shaping (MASH) ADC with a variety of digital filtering configurations. Furthermore, in one embodiment ADC 108 can be configured to operate in an incremental mode or a delta-sigma mode.

In the illustrated embodiment configurable ADC 108 is controlled by control register 106 via control lines 110. In one embodiment, control register 106 includes a multi-bit control register coupled to microprocessor 102. In one embodiment, control register 106 includes a register having logic elements such as, gates, flip-flops, and the like. By selectively setting control register 106, microprocessor 102 can dynamically reconfigure ADC 108 in real-time during operation to meet a plurality of application requirements such as, resolution, input-swing range, data rate, and signal-to-noise ratio.

Figure 2:
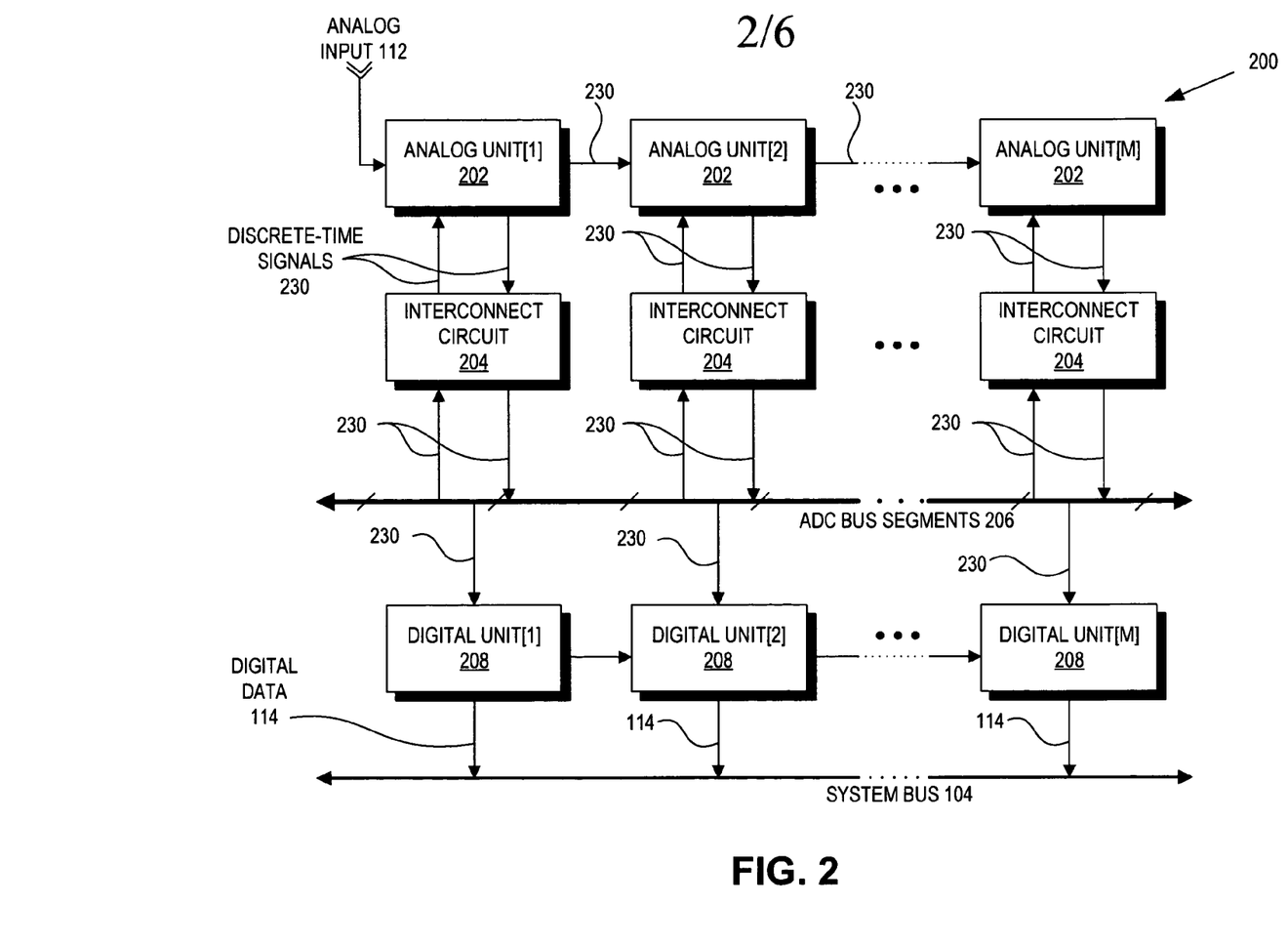
FIG. 2 is a functional block diagram illustrating a configurable analog to digital converter, in accordance with an embodiment of the invention.

FIG. 2 is a functional block diagram illustrating a configurable ADC 200, in accordance with an embodiment of the invention. Configurable ADC 200 represents one possible implementation of ADC 108. The illustrated embodiment of configurable ADC 200 includes analog units 202, interconnect circuits 204, ADC bus segments 206, and digital units 208.

In the illustrated embodiment, analog units 202 are cascaded together to provide a plurality of discrete-time signals 230 responsive to analog input 112. In one embodiment, analog units 202 perform analog integration and are coupled together to provide multiple orders of analog integration of analog input 112. In the illustrated embodiment, each analog unit 202 is coupled to at least one interconnect circuit 204. In one embodiment, interconnect circuits 204 selectively couple analog units 202 to any of the ADC bus segments 206. In one embodiment, interconnect circuits 204 are programmable by control register 106 to couple analog units 202 to one or more of ADC bus segments 206.

In the illustrated embodiment, interconnect circuits 204 are further coupled to selectively feedback any of ADC bus segments 206 to analog units 202. In this embodiment, any discrete-time signal 230 that is output onto ADC bus segments 206 can be feedback to any of analog units 202. For example, interconnect circuits 202 can be configured to feed an output of analog unit[2] back to analog unit[1]. In another example, interconnect circuits 202 can be configured to feed an output of analog unit[1] back to analog unit[M]. By selectively coupling the analog units to any of the ADC bus segments 206 and by selectively feeding back any of the discrete-time signals 230, ADC 200 can be configured for a variety of orders of analog integration. Thus, a single ADC 200 can include a selectable resolution of analog-to-digital conversion and/or can include a selectable signal-to-noise ratio with the programming of interconnect circuits 204.

In the illustrated embodiment, digital units 208 are coupled to ADC bus segments 206 to translate discrete-time signals 230 into digital data 114. In one embodiment, digital units 208 are programmable by control register 106 to couple any of ADC bus segments 206 to the particular digital unit 208. In this embodiment, any discrete-time signal 230 that is on ADC bus segments 206 can be inputted into any digital unit 208. For example, interconnect circuits 204 and digital unit[1] can be configured so that an output of analog unit[2] is input into digital unit[1]. In another example, interconnect circuits 204 and digital unit[2] can be configured so that an output of analog unit[M] is input into digital unit[2].

In the illustrated embodiment, digital units 208 are cascaded together to provide multiple orders of digital integration. In this embodiment, digital units 208 are configurable to input another digital unit's 208 output. In one embodiment, digital units 208 are configurable to input one of the ADC bus segments 206 or one of the outputs from another digital unit 208. By selectively coupling the digital units 208 to one another, ADC 200 can be configured for a variety of orders of digital integration.

By selecting the order of analog integration and selectively configuring the inputs of digital units 208, ADC 200 can be configured to implement a variety of types of analog-to-digital converters. Thus, a single ADC 200 can be utilized to perform a variety of analog-to-digital conversion functions (e.g., analog integration with selectable orders, digital integration with selectable orders, digital filtering, incremental analog-to-digital conversion, sigma-delta analog-to-digital conversion, etc).

Figure 3:
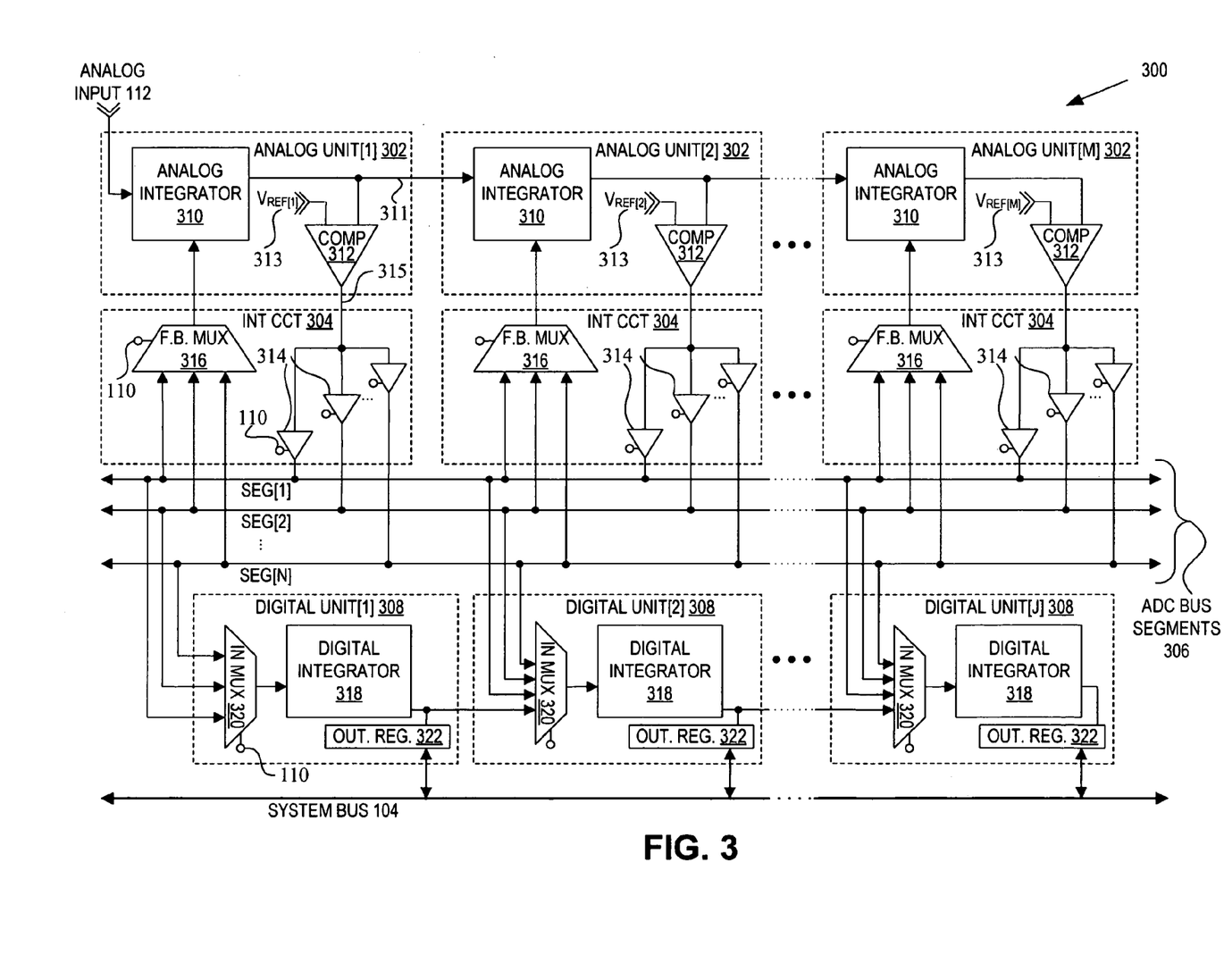
FIG. 3 is a functional block diagram illustrating a configurable analog to digital converter, in accordance with an embodiment of the invention.

FIG. 3 is a functional block diagram illustrating a configurable ADC 300, in accordance with an embodiment of the invention. Configurable ADC 300 represents one possible implementation of ADC 108 or ADC 200. The illustrated embodiment of configurable ADC 300 includes analog units 302, interconnect circuits 304, ADC bus segments 306, and digital units 308. The illustrated embodiment of analog unit 302 includes an analog integrator 310, a comparator 312, and a voltage reference 313. The illustrated embodiment of interconnect circuit 304 includes tri-state buffers 314 and a feedback multiplexer (MUX) 316. The illustrated embodiment of digital unit 308 includes a digital integrator 318, an input MUX 320, and an output register 322.

In one embodiment, analog integrators 310 perform an analog integration of an input signal by translating the input signal into an integrated signal. In one embodiment, each analog integrator 310 includes a switched capacitor modulator. In one embodiment, analog integrators 310 can be represented by a Z-domain transfer function [H(Z)], such as those of equations 1, 2, or 3.

$$H(Z) = \frac{1}{(1-Z^{-1})} \quad \text{(EQ. 1)}$$

$$H(Z) = \frac{Z^{-1}}{(1-Z^{-1})} \quad \text{(EQ. 2)}$$

$$H(Z) = \frac{Z^{-\frac{1}{2}}}{(1-Z^{-1})} \quad \text{(EQ. 3)}$$

Figure 4:
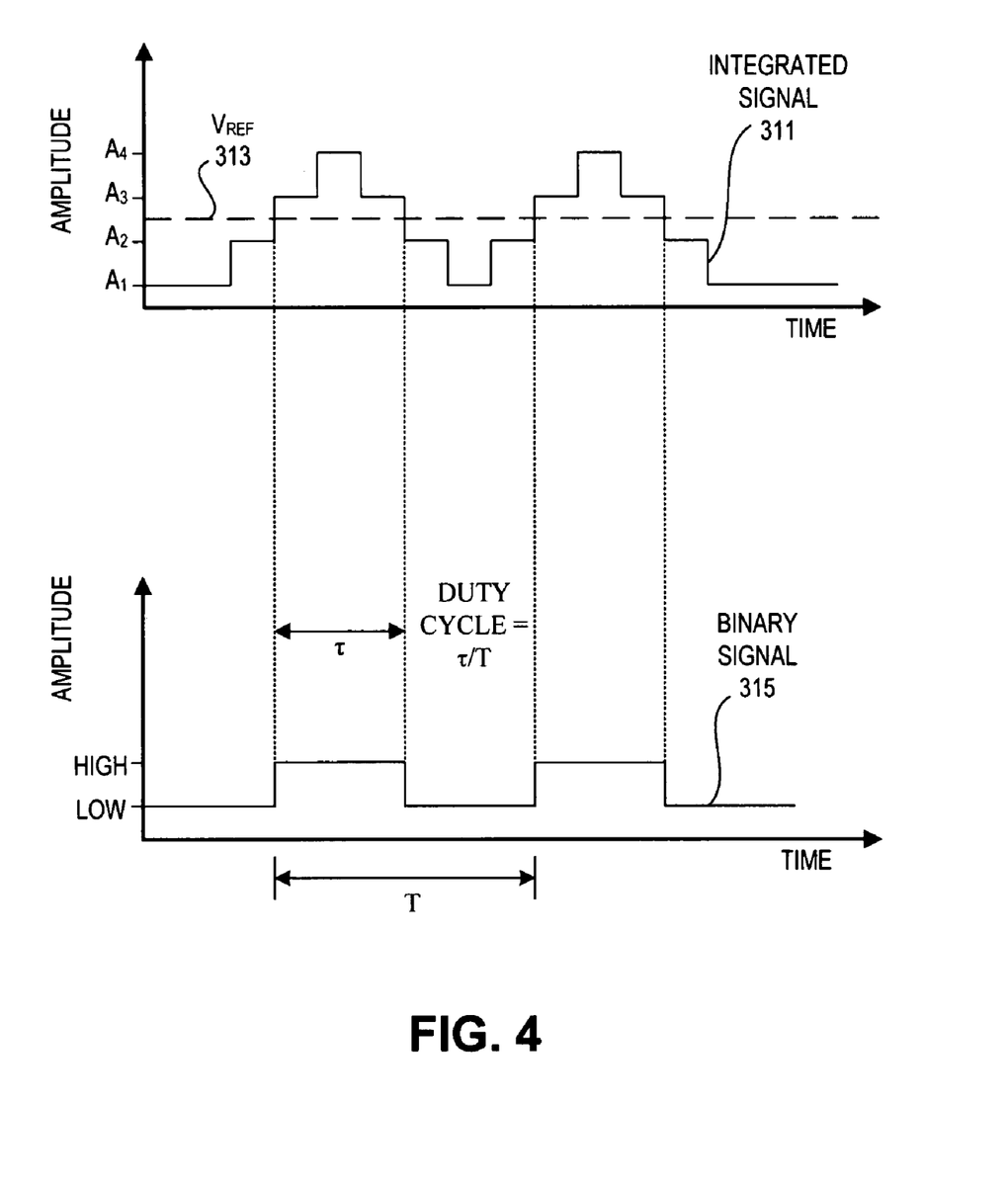
FIG. 4 is a timing diagram illustrating operation of a configurable analog to digital converter, in accordance with an embodiment of the invention.

In the illustrated embodiment, analog integrator 310 of analog unit[1] receives analog input 112 and translates it into integrated signal 311. Integrated signal 311 is then compared to a voltage reference 313 by comparator 312. In one embodiment, comparator 312 quantizes integrated signal 311 and outputs a binary signal 315. In this embodiment, binary signal 315 includes a duty cycle that is representative of analog input 112. For ease of explanation, FIG. 4 illustrates an example integrated signal 311 and an example binary signal 315, in accordance with an embodiment of the invention. As is shown in FIG. 4, integrated signal 311 is a discrete-time signal that includes a plurality of amplitudes (e.g., A1-A4). In operation, comparator 312 compares integrated signal 311 with voltage reference 313. If integrated signal 311 exceeds voltage reference 313 then comparator 312 trips and changes its output, as represented by a change in states from a low to a high in example binary signal 315. The change in states of binary signal 315 as integrated signal 311 rises above and drops below voltage reference 313 results in a duty cycle that is representative of analog input signal 112. For example, in one embodiment, a binary signal 315 with a 50-percent duty cycle represents an analog input signal 112 that is 50-percent between high and low input limits of ADC 300.

Referring now back to FIG. 3, in one embodiment, Vref[1] through Vref[M] can be the same voltage references. In one embodiment, analog integrators 310 output differential integrated signals (not shown). In this embodiment, rather than compare a single-ended integrated signal 311 to Vref 313, comparator 312 compares these differential integrated signals to one another to produce binary signal 315. Using fully differential integrated signals may increase the dynamic range of ADC 300 by rejecting common-mode interference.

As shown in FIG. 3, interconnect circuits 304 include tri-state buffers 314 coupled between comparator 312 and ADC bus segments 306. In one embodiment, tri-state buffers 314 are controlled by control register 106 via control lines 110 to selectively couple the output of comparator 312 to any of ADC bus segments 306. In one embodiment, two or more tri-state buffers 314 may be enabled to simultaneously output binary signal 315 from one of comparators 312 onto two or more of ADC bus segments 306. For example, tri-state buffers 314 can be enabled to simultaneously output binary signal 315 from analog unit[1] onto both segment[1] and segment [2].

Although FIG. 3 illustrates tri-state buffers 314, any device can be utilized to selectively couple the output of comparators 312 to ADC bus segments 306, including, for example, multiplexers, switches, field-effect-transistors, etc. Also, although FIG. 3 illustrates three tri-state buffers 314 per interconnect circuit 304, it is recognized that one or more tri-state buffers 314 can be included dependent, in part, on the number of ADC bus segments 306.

Also included in interconnect circuits 304 are feedback multiplexers 316 coupled between ADC bus segments 306 and analog integrators 310. In one embodiment, feedback multiplexers 316 are controlled by control register 106 via control lines 110 to selectively couple any of ADC bus segments to a feedback of analog integrator 310. In one embodiment, feedback multiplexer 316 is coupled to control a negative feedback of a switched capacitor modulator included in analog integrator 310. Although FIG. 3 only shows one control line 110 per feedback multiplexer 316, it is recognized that one or more control lines 110 can be included dependent, in part, on the number of ADC bus segments 306.

In one embodiment, digital integrators 318 are coupled to perform a digital integration by translating binary signals 315 into digital data 114. Digital integrators 318 can be represented by a Z-domain transfer function similar to that of equation 1. In the illustrated embodiment, digital integrators 318 are selectively coupled to ADC bus segments 306 via input multiplexers (MUXs) 320. In one embodiment, input MUXs 320 are controlled by control register 106 via control lines 110. Although FIG. 3 only shows one control line 110 per input MUX 320, it is recognized that one or more control lines 110 can be included dependent, in part, on the number of ADC bus segments 306.

As can be seen in FIG. 3, digital integrators 318 are cascaded together via input MUXs 320 to provide multiple orders of digital integration. By configuring input MUXs 320 any of these orders of digital integration can be selected for a variety of digital filtering functions (e.g., multiple order digital integration, addition, etc.).

In the illustrated embodiment, digital units 308 include output registers 322 coupled between an output of digital integrators 318 and system bus 104 to output digital data 114. In one embodiment, output registers 322 includes register having logic elements such as, gates, flip-flops, and the like. In one embodiment, output registers 322 are independently addressable by processor 102 to retrieve digital data 114.

Figure 5:
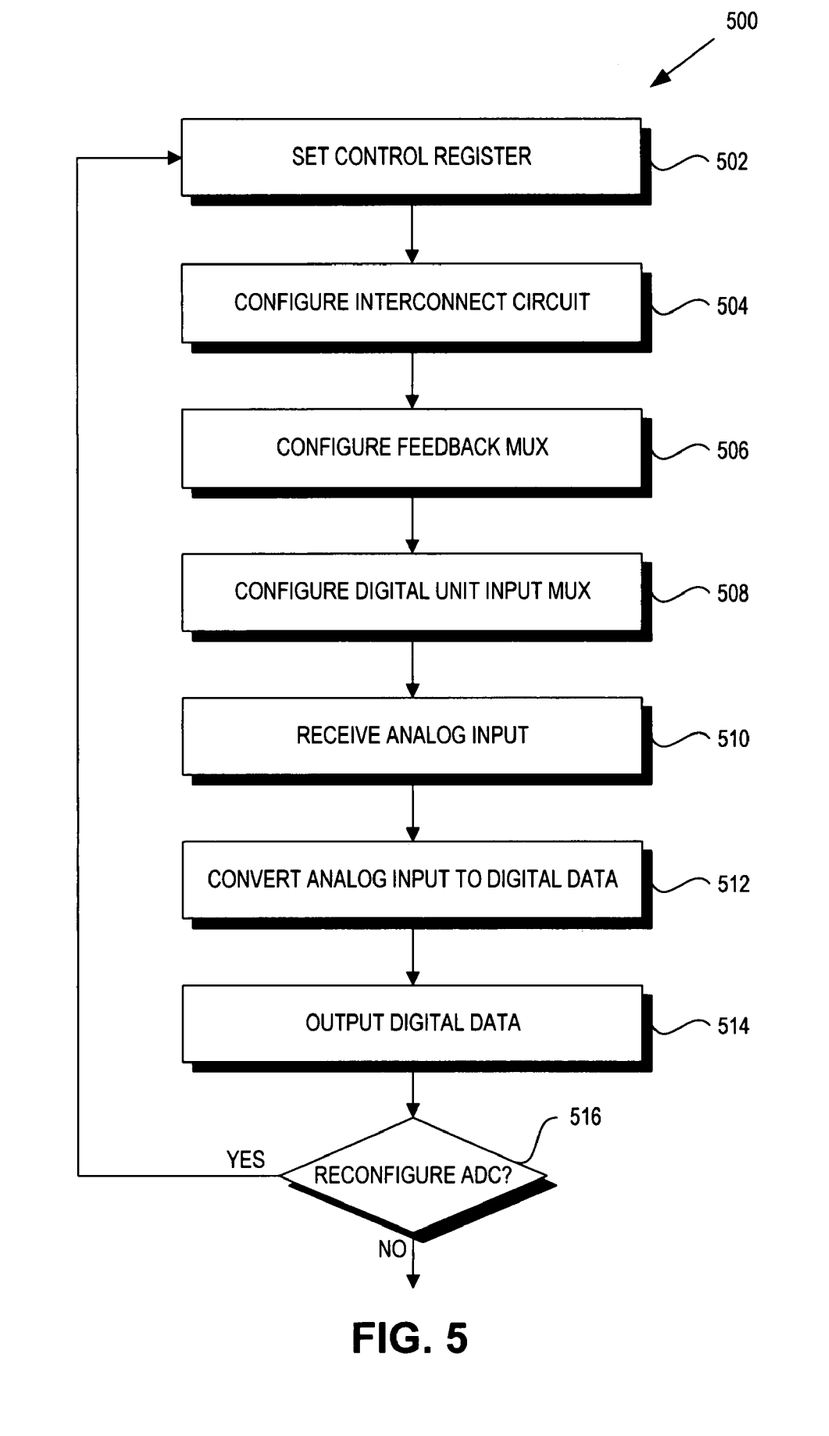
FIG. 5 is a flow chart illustrating a process for configuring a configurable analog to digital converter, in accordance with an embodiment of the invention.

FIG. 5 is a flow chart illustrating a process 500 for configuring a configurable ADC, in accordance with an embodiment of the invention. In some embodiments, process 500 is executed by any of configurable ADCs 108, 200, and 300. Process 500 is described with reference to FIGS. 1, 3 and 5. The order in which some or all of the process blocks appear in process 500 should not be deemed limiting. Rather, one of ordinary skill in the art having the benefit of the present disclosure will understand that some of the process blocks may be executed in a variety of orders not illustrated.

In a process block 502, control register 106 is set. In one embodiment, control register 106 is set by microprocessor 102 via system bus 104. In a process block 504 control register 106 configures interconnect circuits 304 to selectively couple the outputs of comparators 312 to any of the ADC bus segments 306. By way of example, comparators 312 can be coupled to ADC bus segments 306 by selectively enabling one or more of tri-state buffers 314.

In a process block 506, control register 106 selectively configures feedback MUXs 316. In one embodiment, feedback MUXs 316 are configured to feedback any of ADC bus segments 306 to analog integrators 310.

In a process block 508, control register 106 selectively configures input MUXs 320. In one embodiment, input MUXs 320 are configured to selectively couple an input of digital integrators 318 to any of ADC bus segments 306. In one embodiment, at least one of the input MUXs 320 is configured to couple the output of one input MUX 320 to an input of another input MUX 320. For example, input MUX 320 of digital unit[2] can be configured to couple the output of digital unit[1] to the input of digital unit[2].

In a process block 510, once ADC 300 is configured, it may then be coupled to receive analog input 112. The analog input 112 is then converted to digital data 114 (process block 512) using the analog-to-digital configuration set in the previous process blocks 502-508. Once the conversion process is complete, digital data 114 is output onto system bus 104 via output registers 322 (process block 514).

In a decision block 516, ADC 300 may then be reconfigured to perform a second analog to digital conversion using a different configuration. For example, ADC 300 may first be configured to provide an ADC with one order of analog integration and two orders of digital integration and then used to convert analog input 112 into digital data 114. ADC 300 may then be reconfigured, for example, to provide an ADC with two orders of analog integration and three orders of digital integration. Analog input 112 is again converted into digital data 114, this time with increased resolution due to the additional orders of integration.

Figure 6:
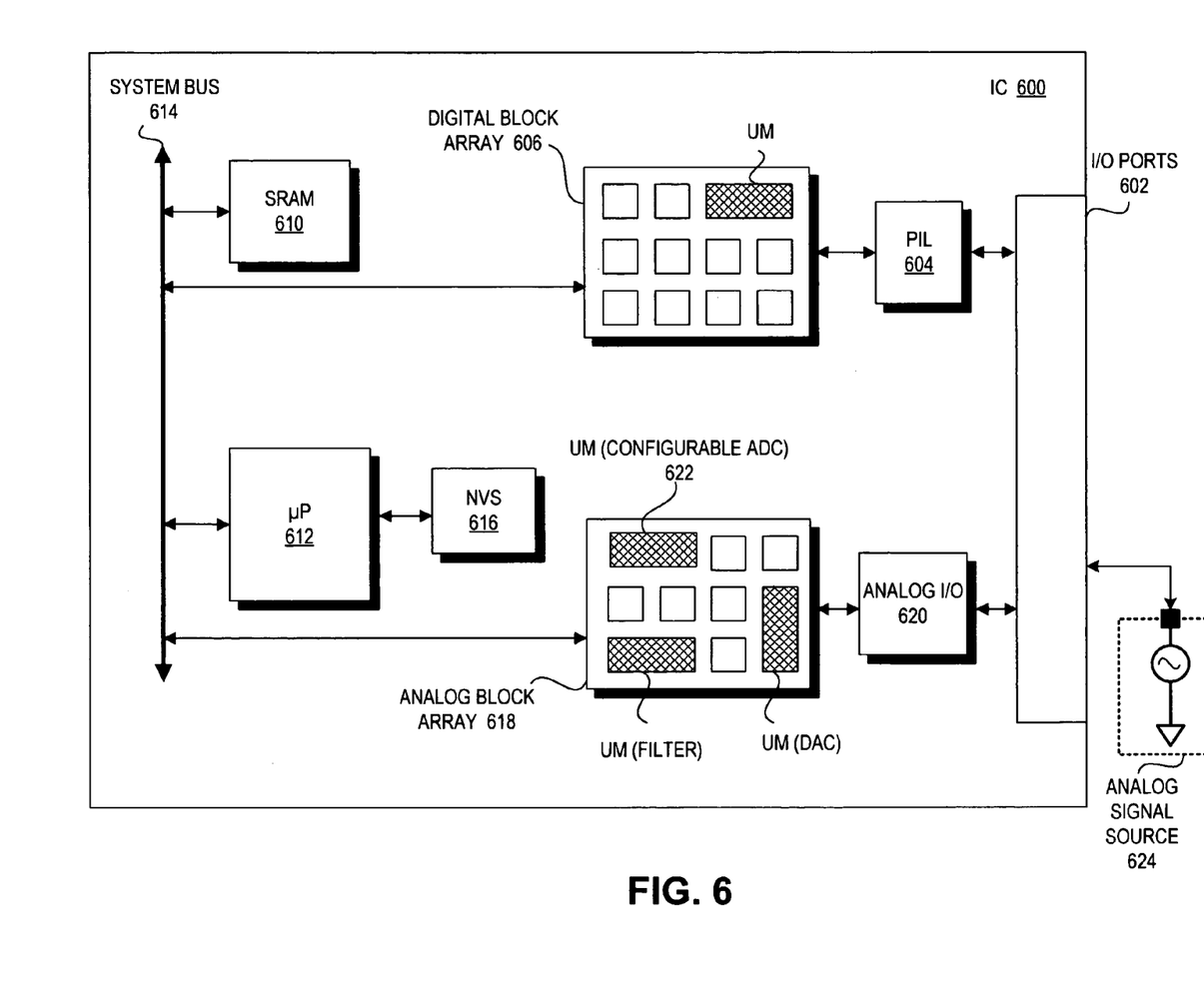
FIG. 6 illustrates a demonstrative integrated circuit for implementing an embodiment of the invention.

FIG. 6 illustrates a demonstrative integrated circuit ("IC") 600 implemented using an embodiment of configurable ADCs 108, 200, or 300. IC 600 may include a Programmable System on a Chip (PSoC™) microcontroller by Cypress Semiconductor Corporation. The illustrated embodiment of IC 600 includes input/output ("I/O") ports 602. I/O ports 602 are coupled to Programmable Interconnect and Logic ("PIL") 604 which acts as an interconnect between I/O ports 602 and a digital block array 606. Digital block array 606 may be configured to implement a variety of digital logic circuits (e.g., DAC, digital filters, digital control systems, etc.) using configurable user modules ("UMs"). Digital block array 606 is further coupled to a system bus 614.

Static Random Access Memory ("SRAM") 610 and microprocessor 612 are also coupled to system bus 614. Microprocessor 612 is coupled to non-volatile storage ("NVS") 616 which may be used to store firmware (e.g., control algorithms executable by microprocessor 102 to implement process 500).

An analog block array 618 is coupled to system bus 614. Analog block array 618 also may be configured to implement a variety of analog circuits (e.g., DACs, analog filters, comparators, buffers, current sources, etc.) using configurable UMs. Analog block array 618 is also coupled to an analog I/O unit 620 which is coupled to I/O ports 602.

As illustrated, configurable ADC 622 can be included in analog block array 618 as a user module. In one embodiment, configurable ADC 622 includes configurable ADC 108, configurable ADC 200, or configurable ADC 300. Configurable ADC 622 can be selectively coupled to analog I/O unit 620 for coupling to an external analog signal source 624 via I/O ports 602. Various subcomponents of ADC 622 may be implemented with various UMs of digital block array 606 or analog block array 618 or the subcomponents may be stand alone components.

The processes explained above are described in terms of computer software and hardware. The techniques described may constitute machine-executable instructions embodied within a machine (e.g., computer) readable medium, that when executed by a machine will cause the machine to perform the operations described. Additionally, the processes may be embodied within hardware, such as an application specific integrated circuit ("ASIC") or the like.

As described above, configurable ADCs 108, 200, or 300 may be incorporated into IC 600, as well as, various other integrated circuits. Descriptions of configurable ADC 108, 200, or 300 may be generated and compiled for incorporation into other integrated circuits. For example, known analog or digital units may be incorporated into the architecture of configurable ADC 300 and used to generate behavioral level code with a hardware descriptive language, such as VHDL or Verilog, and stored to a machine-accessible medium. Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe the architecture of configurable ADCs 108, 200, or 300.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An apparatus comprising:
   a plurality of analog units to integrate an input signal, wherein the plurality of analog units are coupled together to generate a plurality of discrete-time signals responsive to the input signal;
   a plurality of bus segments to propagate at least one of the plurality of discrete-time signals; and
   a plurality of interconnect circuits to selectively couple the plurality of analog units to any of the plurality of bus segments, wherein the plurality of interconnect circuits includes a plurality of feedback multiplexers (MUXs) coupled between the plurality of bus segments and the plurality of analog units to couple any of the plurality of bus segments to the plurality of analog units to feedback any of the plurality of discrete-time signals.

2. The apparatus of claim 1, wherein the plurality of analog units are coupled together to form an analog-to-digital converter (ADC) having a plurality of orders of analog integration, wherein the plurality of interconnect circuits are programmable to select any of the plurality of orders of analog integration.

3. The apparatus of claim 2, wherein the plurality of analog units comprises:
   a plurality of analog integrators to translate the input signal into a plurality of integrated signals, wherein each of the plurality of integrated signals comprises a plurality of amplitudes; and
   a plurality of comparators coupled between the plurality of analog integrators and the plurality of interconnect circuits to compare the plurality of integrated signals to a reference signal and to output a plurality of binary signals, wherein each of the plurality of binary signals comprises a duty cycle representative of the input signal.

4. The apparatus of claim 3, wherein the plurality of interconnect circuits further comprises a plurality of tri-state buffers coupled between the plurality of comparators and the plurality of bus segments to selectively output the plurality of binary signals onto any of the plurality of bus segments.

5. The apparatus of claim 3, wherein the plurality of feedback multiplexers (MUXs) are coupled between the plurality of bus segments and the plurality of analog units to selectively couple any of the plurality of bus segments to the plurality of analog integrators to feedback any of the plurality of binary signals.

6. The apparatus of claim 2, further comprising a plurality of digital units coupled together and to the plurality of bus segments to translate the plurality of discrete-time signals into digital data representative of the input signal.

7. The apparatus of claim 6, wherein the plurality of digital units are coupled together to provide a plurality of orders of digital integration, wherein the plurality of digital units are programmable to output any of the plurality of orders of digital integration.

8. The apparatus of claim 7, wherein the plurality of digital units comprises:
   a plurality of digital integrators; and
   a plurality of input MUXs coupled between the plurality of bus segments and the plurality of digital integrators to selectively couple any of the plurality of bus segments to the plurality of digital integrators.

9. The apparatus of claim 8, wherein the plurality of digital units comprises a first digital unit including a first digital integrator and a second digital unit including a second digital integrator, wherein at least one of the plurality of input MUXs is further coupled between the first and second digital integrator to selectively couple the first digital integrator to the second digital integrator.

10. The apparatus of claim 6, further comprising a multi-bit control register coupled to the plurality interconnect circuits and to the plurality of digital units to independently control each of the plurality interconnect circuits and each of the plurality of digital units.

11. A method comprising:
    configuring a plurality of interconnect circuits coupled between a plurality of analog units and a plurality of bus segments to selectively output a plurality of discrete-time signals onto any of the plurality of bus segments, wherein the plurality of analog units are configured to generate the plurality of discrete-time signals responsive to an input signal; and
    configuring the plurality of interconnect circuits to selectively feedback any of the plurality of discrete-time signals to any of the plurality of analog units, wherein configuring the plurality of interconnect circuits to selectively feedback any of the plurality of discrete-time signals to any of the plurality of analog units includes configuring a plurality of feedback multiplexers (MUXs) coupled between the plurality of bus segments and the plurality of analog units.

12. The method of claim 11, wherein configuring the plurality of interconnect circuits to selectively output the plurality of discrete-time signals onto any of the plurality of bus segments comprises configuring a plurality of tri-state buffers coupled between the plurality of analog units and the plurality of bus segments.

13. The method of claim 11, further comprising configuring a plurality of input MUXs coupled between the plurality of bus segments and a plurality of digital integrators to selectively couple any of the plurality of bus segments to the plurality of digital integrators, wherein the plurality of digital integrators are configured to translate the plurality of discrete-time signals into digital data representative of the input signal.

14. The method of claim 13, wherein configuring the plurality of tri-state buffers, the plurality of feedback MUXs, and the plurality of input MUXs comprises setting a multi-bit control register coupled to independently control each of the plurality of tri-state buffers, each of the plurality of feedback MUXs, and each of the plurality of input MUXs.

15. A system comprising:
   a plurality of analog units coupled together to form an analog-to-digital converter (ADC) having a plurality of orders of analog integration, wherein the plurality of analog units generate a plurality of discrete-time signals responsive to an analog input signal;
   a plurality of bus segments to propagate at least one of the plurality of discrete-time signals;
   a plurality of interconnect circuits coupled between the plurality of analog units and the plurality of bus segments to selectively couple the plurality of analog units to any of the plurality of bus segments, wherein the plurality of interconnect circuits includes a plurality of feedback multiplexers (MUXs) coupled between the plurality of bus segments and the plurality of analog units to couple any of the plurality of bus segments to the plurality of analog units to feedback any of the plurality of discrete-time signals; and
   a processor coupled to configure the plurality of interconnect circuits to select any one of the plurality of orders of analog integration.

16. The system of claim 15, wherein the plurality of interconnect circuits further comprises a plurality of tri-state buffers coupled between the plurality of analog units and the plurality of bus segments, wherein the processor is further configured to independently control each of the plurality of tri-state buffers to selectively output the plurality of discrete-time signals onto any of the plurality of bus segments.

17. The system of claim 16, wherein the processor is further configured to independently control each of the plurality of feedback MUXs to selectively couple any of the plurality of bus segments to the plurality of analog integrators to feedback any of the plurality of discrete-time signals.

18. The system of claim 17, further comprising:
   a plurality of digital integrators coupled together to provide a plurality of orders of digital integration, wherein the plurality of digital integrators generate digital data representative of the analog input signal; and
   a plurality of input MUXs to selectively couple the plurality of bus segments to the plurality of digital integrators and to selectively couple the plurality of digital integrators together, wherein the processor is further configured to independently control each of the plurality of input MUXs to select any of the plurality of orders of digital integration.

19. The system of claim 18, further comprising a multi-bit control register coupled to the plurality of tri-state buffers, the plurality of feedback MUXs, and the plurality of input MUXs to independently control each of the plurality of tri-state buffers, each of the plurality of feedback MUXs, and each of the plurality of input MUXs.

* * * * *